United States Patent [19]

Struven

[11] Patent Number: 5,383,488
[45] Date of Patent: Jan. 24, 1995

[54] APPARATUS AND METHOD FOR PROTECTING CHEMICAL BATH SEALS

[75] Inventor: Kenneth C. Struven, San Carlos, Calif.

[73] Assignee: Imtec Products, Inc., Sunnyvale, Calif.

[21] Appl. No.: 188,817

[22] Filed: Jan. 31, 1994

[51] Int. Cl.⁶ .............................................. F16K 49/00
[52] U.S. Cl. .................... 137/340; 220/4.12; 220/643
[58] Field of Search ............ 137/334, 340, 341; 277/22; 220/643, 4.12, 469

[56] References Cited

U.S. PATENT DOCUMENTS

| 2,446,196 | 8/1948 | Sitney | 137/340 |
|---|---|---|---|
| 2,705,016 | 3/1955 | Saar | 137/340 |
| 2,798,364 | 7/1957 | Morrison | 137/340 |
| 2,929,531 | 3/1960 | Kohlins | 277/22 |
| 3,028,874 | 4/1962 | Burkett | 137/340 |
| 5,014,737 | 5/1991 | Berman | 137/334 |
| 5,054,519 | 10/1991 | Berman | 137/563 |
| 5,056,552 | 10/1991 | Berman | 137/334 |

Primary Examiner—A. Michael Chambers
Attorney, Agent, or Firm—Harris Zimmerman

[57] ABSTRACT

A bath in which articles are processed by immersion in hot liquid chemicals has a chemical receptacle seated in a casing. Wetting of internal components in the casing, such as heating elements and thermal insulation, is prevented by a seal between the receptacle and the rim of the casing. The otherwise exposed seal is isolated from the external environment of the bath by a barrier of flowing water. The water flow shields the sealing material from corrosive chemical drips and fumes and also has a cooling effect which decreases thermal expansion of components in the region of the seal and thereby reduces structural stresses.

18 Claims, 4 Drawing Sheets

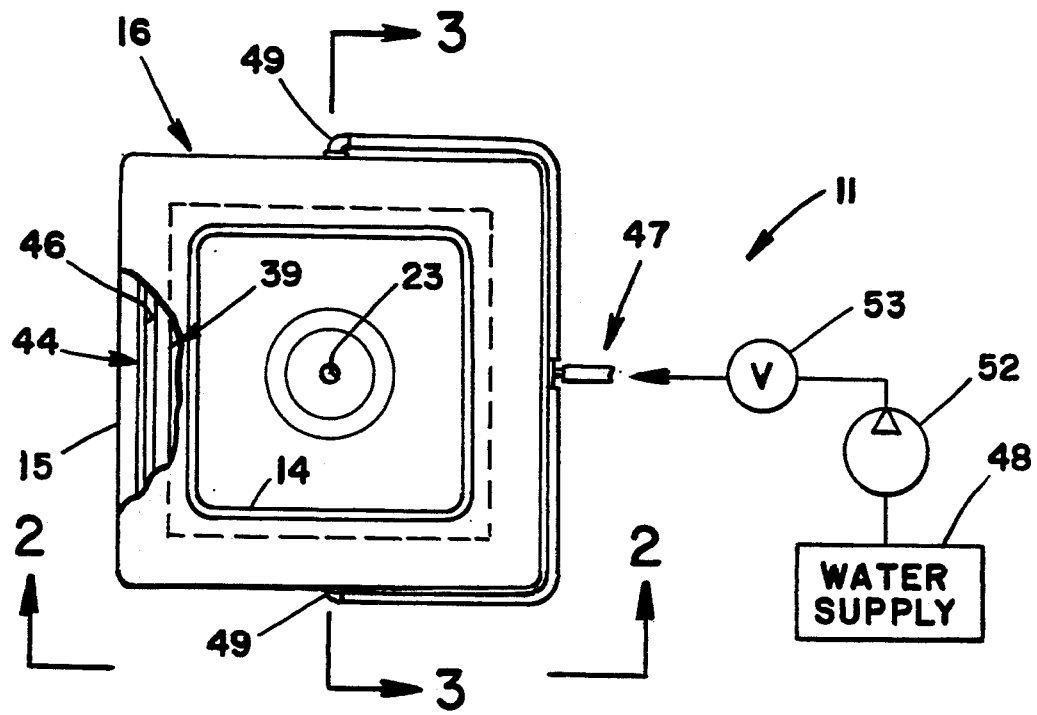
FIG_1
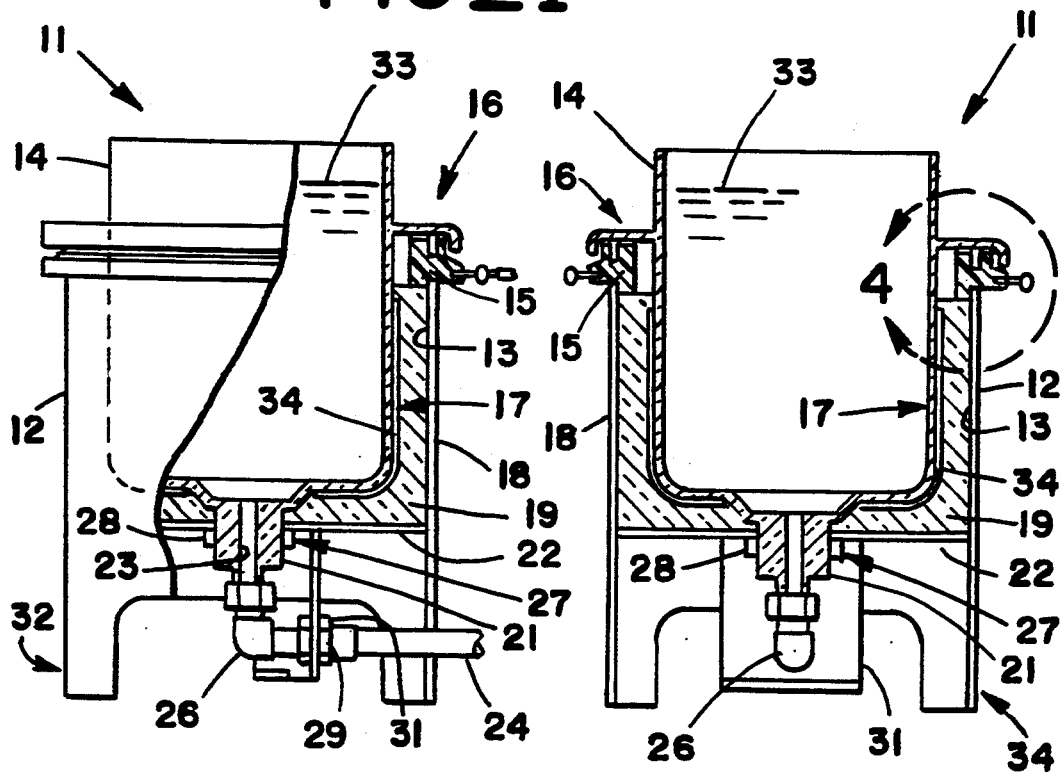
FIG_2    FIG_3

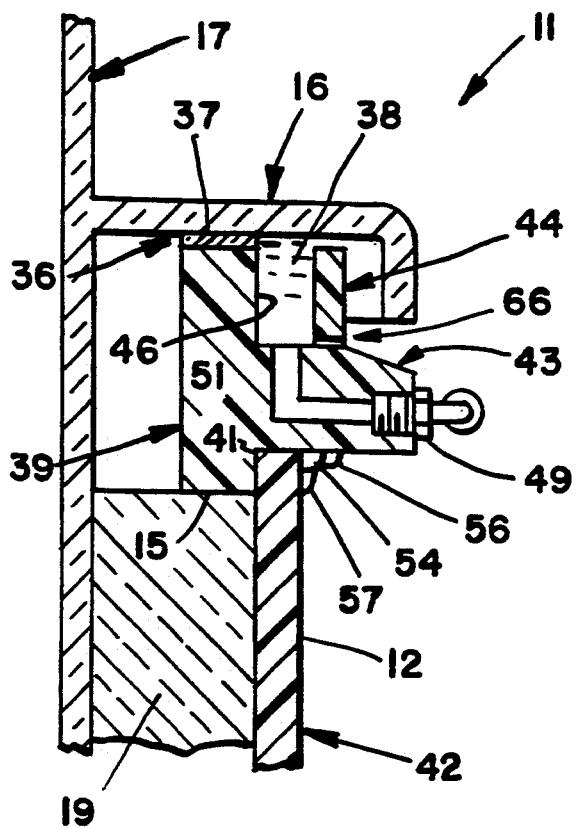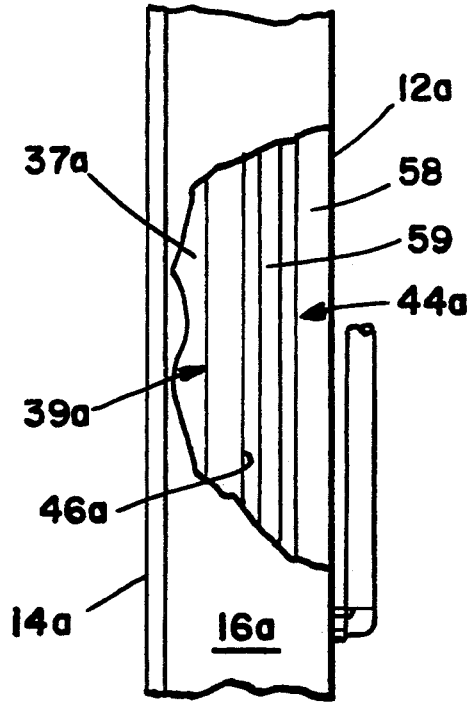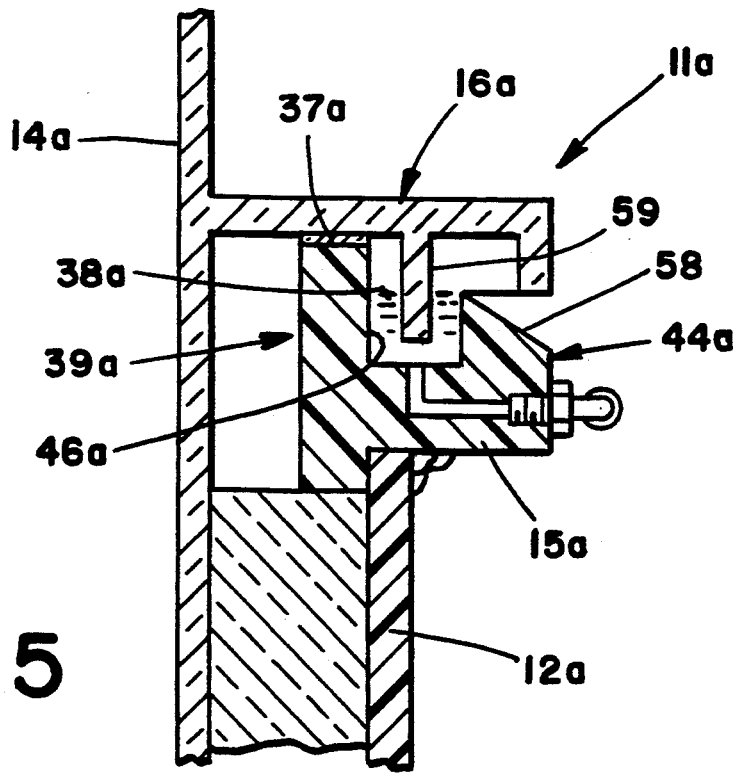

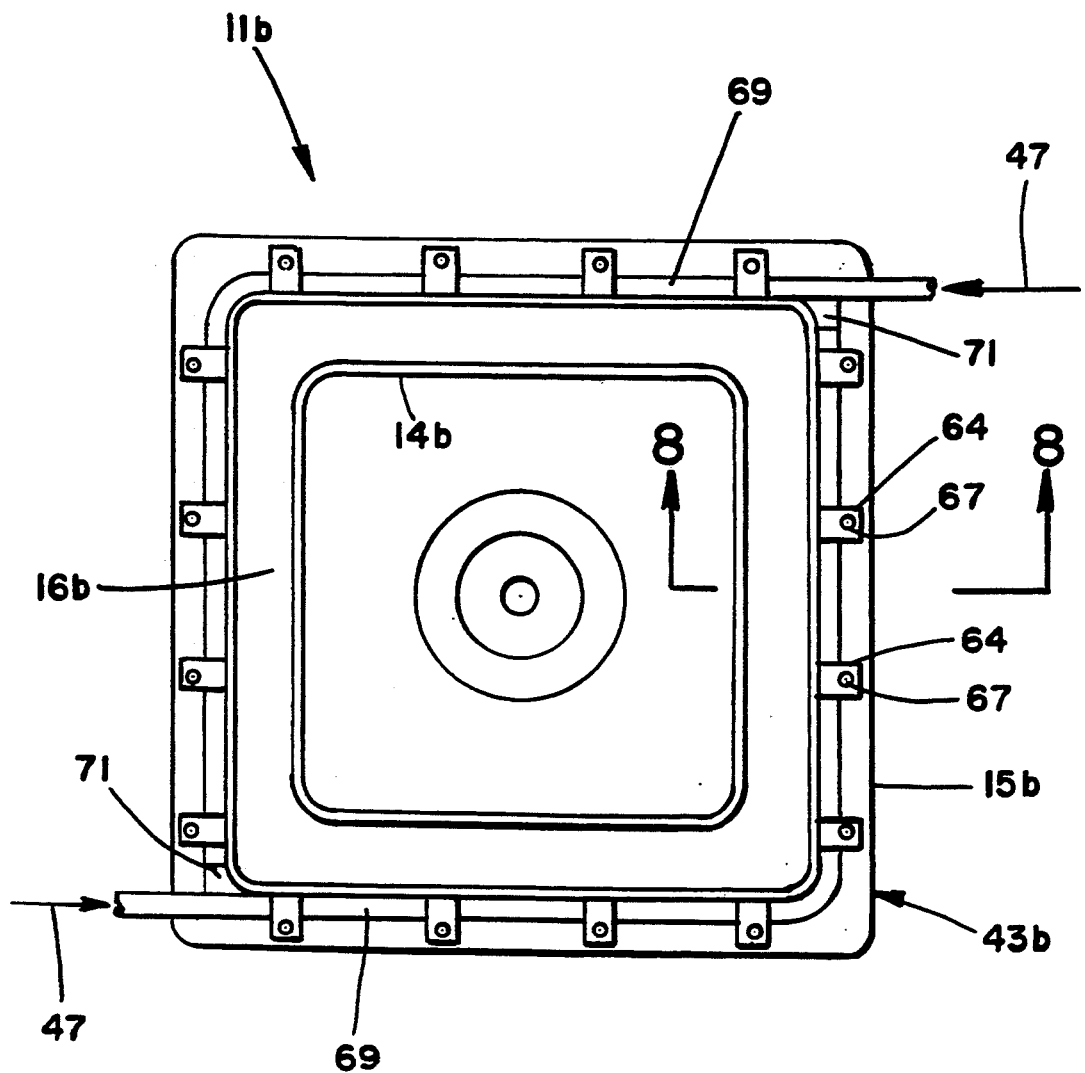
FIG_7

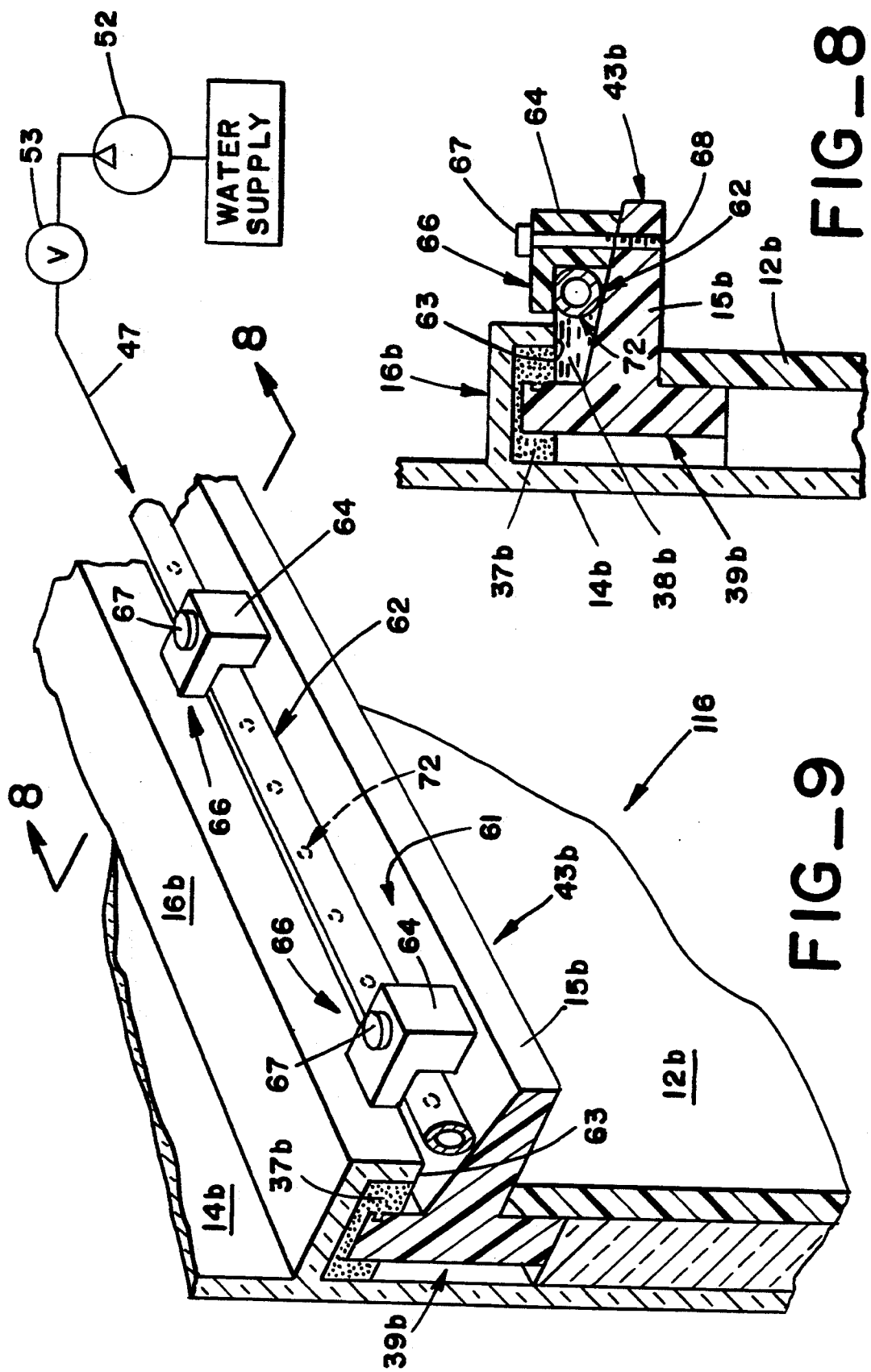

APPARATUS AND METHOD FOR PROTECTING CHEMICAL BATH SEALS

TECHNICAL FIELD

This invention relates to chemical baths in which articles are immersed in hot liquid chemicals during manufacturing of the articles or during other industrial operations. More particularly, the invention relates to sealing of the junctures between components of a chemical bath.

BACKGROUND OF THE INVENTION

A variety of industrial products are processed by immersion in hot and often corrosive liquids. Integrated circuit wafers, for example, are etched and cleaned in this manner. The chemical bath in which such articles are processed typically has a liquid receptacle formed of refractory material which seats in a casing formed of different material such as plastic. The receptacle is supported by an integral flange which overlays the casing rim. Mastic sealing material between the flange and the casing rim assures that internal components within the casing, such as thermal insulation, heating elements and thermocouples, will not be damaged by dripping chemicals, corrosive fumes or moisture.

Chemical bath seals of this kind tend to have an undesirably brief effective life. Among other causes, the materials of which such seals are formed are susceptible to chemical attack by liquids of the types that may be contained in the bath. Various processing activities, such as the removing of treated articles from the bath, may cause dripping of such liquids onto the exterior surfaces of the bath. Degrading of the seal is not limited to instances where the liquid comes into direct contact with the sealing material as fumes emitted by such liquids can also corrode the material. Chemical damage to the sealing material is aggravated by the high temperatures which are present in the vicinity of the seal.

Seal life can also be limited by the thermal cycling which occurs at a chemical bath. The sealant typically bonds three different materials together, the quartz or the like of the chemical receptacle, the plastic of the casing and the sealant itself. These materials undergo different amounts of thermal expansion when heated. This creates repeated stresses which tend to break the bonding of the sealant with the other materials and to disintegrate the sealant itself.

The present invention is directed to overcoming one or more of the problems discussed above.

SUMMARY OF THE INVENTION

In one aspect, the invention provides a chemical bath for immersing articles in hot chemical, the bath being of the type which has a receptacle for containing the chemical and for receiving the articles and which has a casing with a chamber in which at least a portion of the receptacle is seated. Sealing material contacts both the receptacle and the casing to form an airtight seal therebetween, the sealing material being at a region of the bath that is open to the external environment of the bath. At least one flow conduit extends to the open region and a flow of liquid is transmitted thereto through the conduit. Seal protection means forms the liquid at the open region into a body of flowing liquid which isolates the sealing material from the external environment.

In another aspect of the invention, a chemical bath for immersing objects in hot liquid chemical includes a casing having a rim member which extends around the top of the casing. The rim member has an upward extending inner wall, an outward extending shelf situated below the top of the rim member and an upwardly directed lip which is outward from the inner wall and which extends along the shelf. A liquid chemical receptacle is seated in the casing and has an outwardly directed flange extending therearound above the rim member, the flange being spaced apart from the lip to enable an outflow of water over the lip. Thermal insulation is disposed in the casing between the casing wall and the chemical receptacle. Sealing material extends between the rim member and the flange and is exposed to the region between the inner wall and the lip. The apparatus further includes means for delivering a flow of water to the region between the inner wall and the lip to form a body of flowing water therebetween which body of flowing water contacts both the rim member and the flange.

In still another aspect, the invention provides a method of protecting a chemical bath seal which extends between bath components formed of dissimilar materials and which is subjected to heat and wherein the bath produces fumes that can adversely affect the material of which the seal is formed, the seal being at a location on the bath that is open to the external environment of the bath. The method includes the steps of directing a flow of liquid to the seal location and maintaining a body of the flowing liquid in contact with each of the bath components to isolate the seal from the external environment.

The invention extends the life of chemical bath seals by providing a barrier of flowing liquid, which may be water, between the sealant material and the external environment of the bath. The outflowing liquid shields the sealant material from the corrosive effects of hot chemical drips and the fumes that may be emitted by such chemicals. The flow further contributes to seal durability by cooling bath components in the region of the seal, thereby reducing the harmful effects of thermal cycling.

The invention, together with further aspects and advantages thereof, may be further understood by reference to the following description of preferred embodiments and by reference to the accompanying drawings.

BRIEF DESCRIPTION OF THE DRAWINGS

FIG. 1 is a broken out top view of a chemical bath embodying a first example of the invention.

FIG. 2 is a broken out side view of the apparatus of FIG. 1 taken along line 2—2 thereof.

FIG. 3 is a cross section view of the apparatus of FIG. 1 taken along line 3—3 thereof.

FIG. 4 is a cross section view depicting seal components and adjacent structure of the apparatus of the preceding figures, FIG. 4 being an enlarged view of the portion of FIG. 3 that is encircled by dashed line 4 of FIG. 3.

FIG. 5 is a cross section view generally similar to FIG. 4 but depicting a modified form of the seal components and adjacent structure.

FIG. 6 is a broken out top view of the modification of FIG. 5.

FIG. 7 is a top view of a chemical bath depicting still another modification of the invention that is particularly suited for retrofitting onto pre-existing chemical baths.

FIG. 8 is a cross section view taken along line 8—8 of FIG. 7 and showing structural detail of the seat region of the chemical bath.

FIG. 9 is a perspective view of the apparatus of FIG. 8.

DETAILED DESCRIPTION OF THE PREFERRED EMBODIMENTS

Referring jointly to FIGS. 1, 2 and 3 of the drawings, the chemical bath 11 of this embodiment of the invention has an external housing or casing 12 forming a chamber 13 in which a liquid chemical receptacle 14 is seated. An integral flange 16 extends outward from the body 17 of receptacle 14, around the entire periphery of the receptacle and rests on a rim member 15 which extends around the upper end of casing 12. At least the portion of receptacle 14 that is within casing 12 has a smaller size than the casing to provide space between the receptacle and the casing wall 18 in which thermal insulation 19 is disposed.

A cylindrical region 21 of the receptacle 14 at the center of the base of receptacle body 17 extends down through the floor 22 of casing chamber 13 and has a vertical passage 23 through which liquid chemical may be delivered to and withdrawn from the receptacle through a supply pipe 24 and elbow fitting 26 which may be connected to a liquid chemical supply (not shown) of conventional form. The cylindrical region 21 of receptacle 14 is encircled by a seal 27 contained within an annular seal retainer 28 which is secured to the underside of chamber floor 22 by welding. A threaded coupling 29 which connects liquid chemical supply pipe 24 and elbow fitting 26 also clamps the pipe and elbow to a support 31 which extends downward from the chamber floor 22. Casing 12 is formed with a leg 32 at each corner which holds the chamber floor 22 at an elevated location to provide space for the liquid supply components.

Liquid chemical 33 within receptacle 14 is heated by ribbon like electrical heating elements 34 of the resistive type which are disposed against the bottom region and the lower portions of the outer side of the receptacle body 17.

Receptacle 14 is formed of a material which is chemically non-reactive with the liquids which it is to contain and which can withstand high temperatures. In the present example, the receptacle 14 including flange 16 is an integral body of quartz formed by fusing quartz plates gether or by fusing molded quartz sub-assemblies together. Casing 12 and the casing rim member 15 are formed of less brittle and more easily fabricated material such as polypropylene plastic in this particular example.

The casing 12 and receptacle 14 may have configurations which differ from the square shape of this example and the casing side walls 18 need not necessarily extend above the level of flange 16 as in this particular example. The present embodiment of the invention is a chemical bath 11 of the non-recirculating type but the invention is equally applicable to recirculating baths of the kind in which liquid chemical 33 is continously discharged from the receptacle 14 and filtered and then returned to the receptacle. Examples of such recirculating chemical baths are disclosed in prior U.S. Pat. Nos. 5,014,737; 5,054,519 and 5,056,552 which prior patents are incorporated herein by reference.

Referring now to FIGS. 1 and 4 in conjunction, the juncture between receptacle flange 16 and the casing rim member 15 is provided with a seal 36, formed by mastic sealing material 37 in this example. Seal 36 protects the thermal insulation 19 and other components which are within casing 12 from contact with reactive chemicals, fumes and moisture that may be present in the external environment of the bath 11. The present invention protects the seal 36 itself from chemical attack by directing a flow of liquid to a location between the seal 36 and the external environment and by maintaining a body 38 of the flowing liquid in contact with both the receptacle flange 16 and casing rim member 15 to isolate the seal from the external environment. The liquid may be water, preferably of the de-ionized type, although other liquids may be used if desired.

In this embodiment, the receptacle flange 16 extends outward from the receptacle body 17 above casing rim member 15 and then downward for a shorter distance. Rim member 15 has an inner wall region 39 which overlaps the upper edge 41 of the casing wall 42 within the casing and which extends upward to a level slightly below the level of the undersurface of flange 16. Sealing material 37 is situated between the upper end of the inner wall region 39 and the undersurface of the flange 16 in contact with each thereof. A shelf region 43 of rim member 15 extends outward from the inner wall region 39 immediately above upper edge 41 of the casing wall and in spaced apart relationship with receptacle flange 16. Means for forming the flowing liquid into a body 38 of liquid that isolates the sealing material 37 from the external environment includes a lip region 44 of rim member 15 which extends upward from the shelf region 43 at a location which is outward from and spaced apart from the wall region 39. Thus the wall region 39, lip region 44 and the portion of the shelf region 43 which extends therebetween form a groove 46 which extends continuously around the periphery of the bath 11 below flange 16. The upper end of lip region 44 is slightly spaced apart from the undersurface of flange 16 to enable a continuous outflow of water over the lip region. The portion of shelf region 43 which is outward from lip region 44 preferably slopes downward to facilitate run off of the water outflow and run off of any hot liquid chemical drippage which may be deposited on the shelf region.

A flow conduit 47 delivers water from a water supply 48 to groove 46 at a rate sufficient to maintain the body of water 38 in in contact with flange 16. The conduit 47 is branched in this embodiment and delivers the water flow to groove 46 at two locations, which are at opposite sides of the bath 11, through inlet fittings 49 and passages 51 in rim member 15 which passages communicate with the base of the groove. Delivery of the water flow at two or more spaced apart locations causes the water at successive locations along the groove 46 to have a more uniform temperature and more effectively cools the region of the seal 36. In this example, the water flow from supply 48 to conduit 47 is provided by a pump 52 and is delivered through a valve 53 which enables adjustment of the flow rate. A pre-existing source of suitable water under pressure is available at many installations where chemical baths are used and thus a separate pump 52 is not always necessary.

In addition to preventing entry of corrosive liquid or fumes into the location of the sealing material 37, the water flow reduces thermally induced stressing of the brittle quartz flange 16 and stressing of the bonds between the sealing material 37 and the flange and rim member. Stresses are reduced as the cooling effect of the flow reduces the amount of thermal expansion of such components that occurs during operation of the bath.

The juncture of the top edge 41 of the casing wall 42 with rim member 15 is sealed with a triple bead plastic weld which further reduces stressing of the brittle quartz flange 16. The weld has a first bead 54 bonded to both the casing wall 42 and rim member 15, a second bead 56 bonded to bead 54 and the underside of the rim member and a third bead 57 bonded to bead 54 and the casing wall. The plastic of which the weld is formed is somewhat flexible when in the above described configuration and the weld acts as a hinge in that a small amount of rocking movement of rim member 15 relative to casing wall 42 is possible. Thus the rim member 15 may adjust to flexing of casing wall 42 instead of transmitting stress to quartz flange 16.

The lip region 44 of rim member 15 is preferably penetrated by one or more small drain passages 60 which extend from the floor of groove 46 to the down sloping upper surface of the shelf region 43. This allows water to drain from groove 46 when the bath 11 is shut down. The passages 60 are sized to limit flow through the passages to a flow that is smaller than the inflow of water to groove 46 during operation of the bath 11.

The configurations of components in the vicinity of the seal may take other forms while still realizing the objective of isolating the sealing material 37 from the outside environment of the bath. FIGS. 5 and 6 depict one modification of the seal region of the bath in which the lip region 44a of the rim member 15a does not extend as far upward as in the first embodiment and has a down sloping upper surface 58 which extends to the outer edge of the rim member. The receptacle flange 16a is formed with an integral lip 59 which extends down into the groove 46a between the rim member inner wall region 39a and lid region 44a. The flange lip 59 is spaced apart from wall region 39a and lip region 44a of the rim member and from the base of groove 46a. Thus flowing water 38a fills the groove 46a at both sides of the flange lip 59 and overflows down the sloping upper surface 58 of the lip region 39a of the rim member 15a. This isolates the sealing material 37a from the outside environment without actual contact of the water with the sealing material. Except as herein described, the chemical bath 11a of FIGS. 5 and 6 may be similar to the first embodiment of the invention as described with reference to FIGS. 1 to 4.

In each of the embodiments of the invention which are herein described, the outflow of water around the circumference of the chemical bath simply drops to the underlying floor as the floors of facilities where such baths are located typically have drain outlets for collecting spilled or overflowing liquids. If necessary, a trough can be disposed below the rim members to collect the outflow and deliver it to a suitable drain.

The previously described embodiments of the invention have a rim member 15, 15a and in one case a receptacle flange 16a with configurations that differ from the configurations of the corresponding components of prior chemical baths. Referring now to FIGS. 7, 8 and 9, the invention can be retrofitted onto prior chemical baths 11b, having a flange 16b and rim member 15b of known form, by simply adding additional components.

The rim member 15b of the prior chemical bath 11b has an inner wall region 39b which extends up towards receptacle flange 16b and a shelf region 43b which extends outward below the flange, in spaced apart relationship with the flange, for a greater distance than the flange itself extends. The upper surface 61 of shelf region 43b slopes downward towards the outer edge of the rim member 15b. The sealing material 37b extends between the undersurface of the flange and the upper end of rim member 15b and is bonded to both. A construction of this general type is disclosed in prior U.S. Pat. No. 5,056,552.

In order to protect the sealing material 37b in accordance with this embodiment of the invention, a tubular conduit 62 is disposed on the upper surface 61 of shelf region 43b of the rim member 15b and extends along the rim member in parallel relationship with the rim member. The conduit 62 is spaced outward from flange 16b and has a diameter sufficient to cause the conduit to extend up to the level of the lower edge 63 of flange 16b and preferably to a slightly higher level.

Conduit 62 is held in place by a series of spaced apart clamps 64 which are situated at intervals along the length of the conduit and each of which has an arm 66 that extends over the conduit in contact therewith. Clamps 64 are secured to rim member 15b by screws 67 that engage in threaded passages 68 in the rim member. Conduit 62 is preferably formed of resilient material such as plastic tubing and clamps 64 are preferably proportioned to press the conduit against rim member 15b to prevent water leakage under the conduit.

Conduit 62 in this example is formed by two separate lengths of tubing 69 each of which extends around one half of the circumference of the chemical bath 11b. Sealing material 41 closes the end of each length of tubing 69 and extends to the other length of tubing to prevent water leakage at the regions of the sealing material. Alternately, the conduit 62 can be formed by a different number of lengths of tubing 69 which collectively encircle the bath 11b or by a single continuous loop of tubing which extends around the entire circumference of the bath.

A flow of water from supply 48 is delivered to the conduit 62 through pump 52, valve 53 and hose 47. Aperatures 72 which are spaced apart along the sidewall of conduit 62 release water into the region which is between the conduit and the inner wall portion 39b of the rim member 15b. The body of water 38b in that region is forced to rise to a level at which it contacts the lower edge 63 of flange 16b in order to overflow the barrier formed by the conduit 62. Thus the sealing material 37b is isolated from the external environment by the body of outflowing water and is thereby protected from chemical attack and also cooled in the process.

While the invention is particularly useful for protecting the material which seals the junction of the receptacle flange and casing rim, it can also be used to protect seals at other locations in a chemical bath where the seals may be subject to chemical attack.

While the invention has been described with reference to certain specific embodiments for purposes of example, many modifications and variations are possible and it is not intended to limit the invention except as defined in the following claims.

I claim:

1. A method of protecting a chemical bath seal which extends between bath components formed of dissimilar materials and which is subjected to heat and wherein said bath produces fumes that can adversely affect the material of which said seal is formed and wherein said seal is at a location on said bath that is open to the external environment of said bath and which is exposed to said fumes, comprising the steps of directing a flow of liquid to said open location and maintaining a body of said flowing liquid at said open location including maintaining said liquid body in contact with each of said components at said open location to isolate said seal from said external environment.

2. In a chemical bath for immersing articles in hot chemical, said bath having a receptacle for containing said chemical and for receiving said articles and having a casing with a chamber therein in which at least a portion of said receptacle is seated and further having sealing material which contacts both said receptacle and said casing to form an airtight seal therebetween, said sealing material being at a region of said bath that is open to the external environment of said bath, the improvement comprising:

at least one flow conduit extending to said region that is open to the external environment, means for transmitting a flow of liquid to said region through said conduit and seal protection means for forming said liquid at said region into a body of flowing liquid which is exposed to said external enironment at said region of said bath and which isolates said sealing material from said external environment.

3. In a chemical bath for immersing articles in hot chemical, said bath having a receptacle for containing said chemical and for receiving said articles and having a casing with a chamber therein in which at least a portion of said receptacle is seated and further having sealing material which contacts both said receptacle and said casing to form an airtight seal therebetween, said sealing material being at a region of said bath that is open to the external environment of said bath, the improvement comprising:

at least one flow conduit extending to said region that is open to the external environment, means for transmitting a flow of liquid to said region through said conduit and seal protection means for forming said liquid at said region into a body of flowing liquid which isolates said sealing material from said external environment, wherein said casing has a rim member with a surface which extends horizontally along the base of said open region and wherein said seal protection means includes a first member which extends along said surface and which extends upward therefrom at a location which is spaced outward from said sealing material and wherein said liquid flow transmitting means delivers said flow of liquid to said open region at least at one location between said sealing material and said first member to form said body of flowing liquid therebetween, said bath having airtight components which enclose said sealing material except at said open region and which include a second member that spaced apart from said first member and which contacts said body of flowing liquid at said open region.

4. In a chemical bath for immersing articles in hot chemical, said bath having a receptacle for containing said chemical and for receiving said articles and having a casing with a chamber therein in which at least a portion of said receptacle is seated and further having sealing material which contacts both said receptacle and said casing to form an airtight seal therebetween, said sealing material being at a region of said bath that is open to the external environment of said bath, the improvement comprising:

at least one flow conduit extending to said region that is open to the external environment, means for transmitting a flow of liquid to said region through said conduit and seal protection means for forming said liquid at said region into a body of flowing liquid which isolates said sealing material from said external environment, wherein the portion of said casing that is contacted by said sealing material is a rim member that extends along the upper edge of said casing and wherein said receptacle has a flange which extends above said casing rim member, said sealing material being between said rim member and said flange and being in contact with each thereof and wherein said body of flowing liquid is between said casing rim member and said receptacle flange and contacts each thereof at a location which is outward from said sealing material.

5. The chemical bath of claim 4 wherein said rim member and said flange and said body of liquid extend around the entire periphery of said chemical bath.

6. In a chemical bath for immersing articles in hot chemical, said bath having a receptacle for containing said chemical and for receiving said articles and having a casing with a chamber therein in which at least a portion of said receptacle is seated and further having sealing material which contacts both said receptacle and said casing to form an airtight seal therebetween, said sealing material being at a region of said bath that is open to the external environment of said bath, the improvement comprising:

at least one flow conduit extending to said region that is open to the external environment, means for transmitting a flow of liquid to said region through said conduit and seal protection means for forming said liquid at said region into a body of flowing liquid which isolates said sealing material from said external environment, wherein said casing has a rim member extending horizontally along the top of said chamber and wherein said receptacle has an outwardly directed flange which is an integral portion of said receptacle and which extends above said casing rim member, said sealing material being located between said rim member and said flange and being bonded to each thereof, said body of liquid being between said rim member and said flange and being in contact with each thereof at a location which is between said sealing material and said external environment.

7. The chemical bath of claim 6 wherein said seal protection means includes an upward directed lip which extends along said casing rim member at a location which is outward from said sealing material and below said flange, said lip having an upper end which is spaced apart from said flange to enable outflow of liquid over said lip and wherein said liquid flow transmitting means delivers said liquid flow to a location between said sealing material and said lip.

8. The chemical bath of claim 7 wherein at least one drain passage extends through said lip and wherein said liquid flow transmitting means delivers liquid to said location at a rate that exceeds the rate at which liquid can drain therefrom through said drain passage.

9. In a chemical bath for immersing articles in hot chemical, said bath having a receptacle for containing said chemical and for receiving said articles and having a casing with a chamber therein in which at least a portion of said receptacle is seated and further having sealing material which contacts both said receptacle and said casing to form an airtight seal therebetween, said sealing material being at a region of said bath that is open to the external environment of said bath, the improvement comprising:

at least one flow conduit extending to said region that is open to the external environment, means for transmitting a flow of liquid to said region through said conduit and seal protection means for forming said liquid at said region into a body of flowing liquid which isolates said sealing material from said external environment, wherein said casing has a rim member which extends along said chamber and said receptacle has a flange which extends outward over said rim member, said rim member having an inner wall which extends upward towards said flange and an upwardly directed lip having an upper edge that is spaced apart from said flange to enable an outflow of fluid therebetween, said inner wall and said lip being spaced apart to form a groove which extends along said rim member below said flange and wherein said liquid flow transmitting means delivers said liquid flow to said groove to form said body of flowing liquid therein, said sealing material being disposed between said inner wall and said flange.

10. The chemical bath of claim 9 wherein said flange has a horizontally extending undersurface which faces said groove and wherein said lip is of sufficient height to maintain said body of liquid in contact with said undersurface of said flange.

11. The chemical bath of claim 9 wherein said flange has a downwardly directed rib extending along said flange which rib is positioned to contact said body of liquid, said rib being spaced apart from each of said inner wall and said lip.

12. The chemical bath of claim 11 wherein said rib extends below the level of said upper edge of said lip.

13. In a chemical bath for immersing articles in hot chemical, said bath having a receptacle for containing said chemical and for receiving said articles and having a casing with a chamber therein in which at least a portion of said receptacle is seated and further having sealing material which contacts both said receptacle and said casing to form an airtight seal therebetween, said sealing material being at a region of said bath that is open to the external environment of said bath, the improvement comprising:

at least one flow conduit extending to said region that is open to the external environment, means for transmitting a flow of liquid to said region through said conduit and seal protection means for forming said liquid at said region into a body of flowing liquid which isolates said sealing material from said external environment, wherein said receptacle has an outwardly directed flange and said casing has a rim member situated below said flange and extending in parallel relationship therewith, said rim member having an upwardly directed inner wall which extends towards said flange and a shelf which is spaced apart from said flange and which extends outward from said inner wall below said flange, said sealing material being situated between said inner wall and said flange in contact with each thereof and wherein said seal protection means includes a flow barrier extending along said shelf and extending upward therefrom to a level at least as high as the level of the lowermost portion of said flange, said barrier being spaced apart from said flange whereby liquid may overflow said barrier and wherein said liquid flow transmitting means delivers said liquid to the region between said inner wall and said barrier.

14. The chemical bath of claim 13 wherein said barrier is a component of said liquid flow transmitting means and has a flow passage therein for delivering liquid from said inlet to said region between said inner wall and said barrier.

15. The chemical bath of claim 14 wherein said barrier is tubing extending along said shelf in contact therewith.

16. The chemical bath of claim 15 wherein said tubing is formed of resilient material, further including means for pressing said tubing against said shelf.

17. The chemical bath of claim 14 wherein said barrier has a plurality of spaced part flow apertures communicating said flow passage with said region between said inner wall and said barrier.

18. A chemical bath for immersing objects in hot liquid chemical comprising:

a casing having a chamber therein and having a rim member which extends around the top of said casing, said rim member having an upward extending inner wall and an outward extending shelf situated below the top of said rim member and further having an upwardly directed lip which is outward from said inner wall and spaced apart therefrom and which extends along said shelf, a liquid chemical receptacle seated in said casing and having an outwardly directed flange extending therearound above said rim member, said flange being spaced apart from said lip to enable an outflow of water over said lip, thermal insulation disposed in said chamber between said casing and said chemical receptacle, sealing material extending between said rim member and said flange and being in contact with each thereof, said sealing material being exposed to the region between said inner wall and said lip, and means for delivering a flow of water to said region between said inner wall and said lip to form a body of flowing water therebetween which body of flowing water contacts both of said rim member and said flange.

* * * * *